United States Patent [19]

Kong et al.

[11] 3,917,984

[45] Nov. 4, 1975

[54] PRINTED CIRCUIT BOARD FOR MOUNTING AND CONNECTING A PLURALITY OF SEMICONDUCTOR DEVICES

[75] Inventors: George C. Kong; Elwood J. Carroll, both of Ottawa, Canada

[73] Assignee: Microsystems International Limited, Montreal, Canada

[22] Filed: Oct. 1, 1974

[21] Appl. No.: 511,016

[52] U.S. Cl. ....... 317/101 CC; 174/68.5; 339/17 CF

[51] Int. Cl.² ........................................ H05K 1/18

[58] Field of Search ...................... 174/68.5, DIG. 3; 317/101 CC, 101 CM, 101 A; 339/17 CF

[56] References Cited

UNITED STATES PATENTS

| | | | |
|---|---|---|---|
| 3,418,535 | 12/1968 | Martinell | 317/101 CM |
| 3,538,389 | 11/1970 | Levesque et al. | 174/685 X |
| 3,546,539 | 12/1970 | Wilcox, Jr. et al. | 317/101 CC |
| 3,605,062 | 9/1971 | Tinkelberg et al. | 174/DIG. 3 UR |
| 3,605,063 | 9/1971 | Stewart | 317/101 CM |
| 3,644,792 | 2/1972 | Fields | 174/68.5 X |
| 3,691,429 | 9/1972 | Glaser | 317/101 CC |

*Primary Examiner*—Darrell L. Clay
*Attorney, Agent, or Firm*—Sidney T. Jelly

[57] ABSTRACT

A plurality of semiconductor devices can be quickly and easily mounted and demounted from a board, and bias voltages and test equipment quickly and easily connected to the various devices simultaneously by providing a printed circuit board having a plurality of socket mounting positions. Sockets are permanently attached and corresponding pin contacts of each socket are electrically connected in parallel with each other and connected to a connector pad on the board. External contact pads are also provided on the board adjacent the connector pads. Interconnections are made between external contact pads and the connector pads, and between connector pads, to connect to the related pin contacts of all sockets. Devices can be inserted into and removed from the sockets readily and any desired bias voltage and other electrical connection can be made to the devices simply and such connections can be varied without rewiring the board.

4 Claims, 7 Drawing Figures

PRINTED CIRCUIT BOARD FOR MOUNTING AND CONNECTING A PLURALITY OF SEMICONDUCTOR DEVICES

This invention relates to a printed circuit board for mounting and connecting a plurality of semiconductor devices. In particular the invention relates to a printed circuit board, hereinafter referred to as PCB's, as are used for mounting a plurality of devices, such as integrated circuits (IC's), for simultaneous testing, for burn-in, and other uses.

Wiring, or wirewrapping, of PCB's for purposes as above, are expensive in labour costs and time involved. Also, solder shorts, cold solder joints and bad contacts severely restrict the reliability of such boards. Any change in wiring, as for example, a change in bias to be applied to a pin of a device, requires a change to every position of a device.

The present invention provides a PCB on which are permanently mounted a plurality of sockets. The sockets are generally all of the same form and the corresponding contact pins of the sockets are paralleled and connected to contact pads at one side of the boards. The contact pads can be connected by jumpers to edge contacts in a predetermined pattern. Thus, for example using sockets having eighteen contact pins, contact pin number one of each socket is paralleled, and so on. If a wiring change is required, only one connection needs to be changed.

The invention will be readily understood by the following description of one embodiment, by way of example, in conjunction with the accompanying drawings, in which:

FIG. 1 is a plan view of the top side of a PCB showing the printed circuit on the top surface and positions for mounting sockets;

FIG. 1*a* is an enlarged view of one position for mounting sockets;

Figure 1:
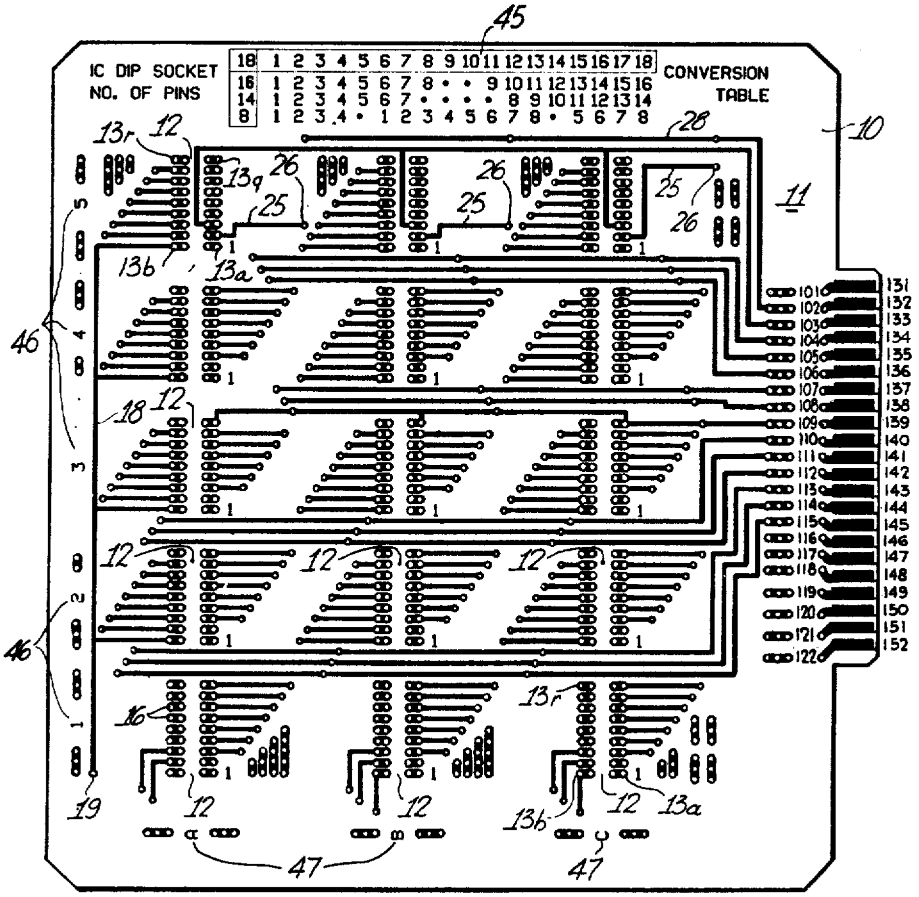
Figure 1A:
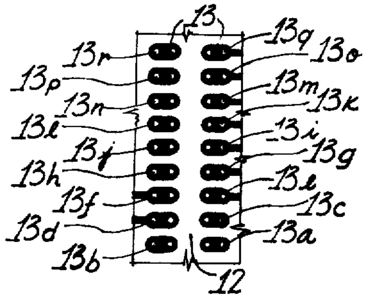
Figure 2:
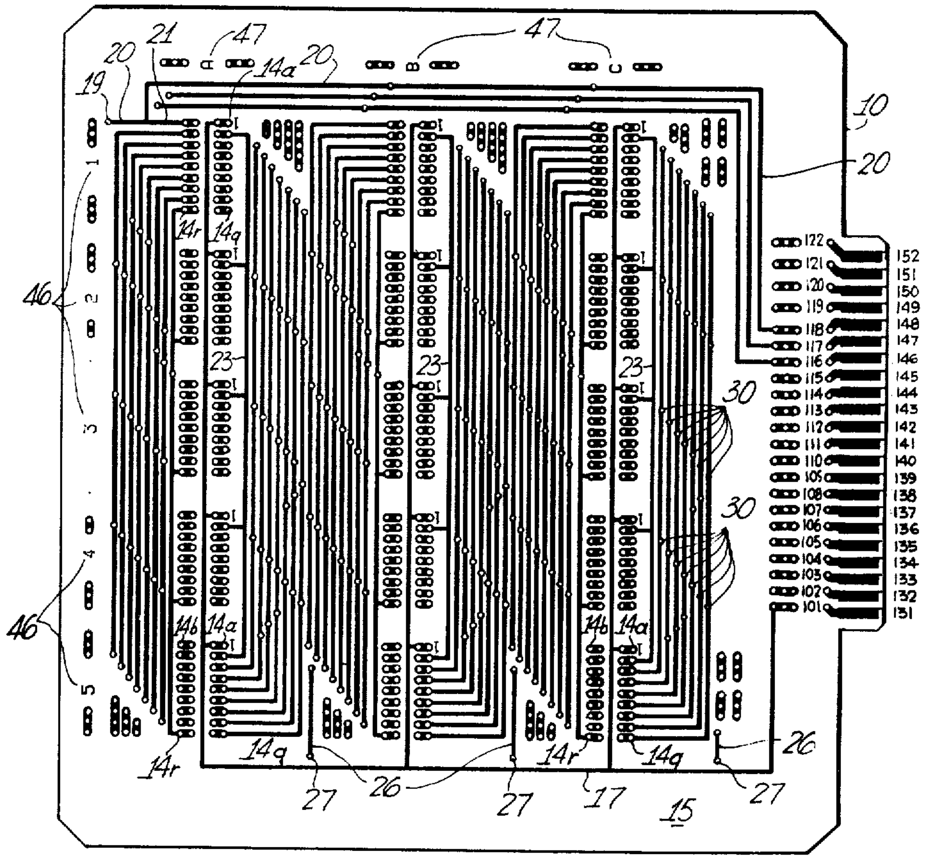
FIG. 2 is a plan view of the under side of a PCB, as in FIG. 1, showing the printed circuit interconnecting the various pin positions.

As illustrated in FIGS. 1 and 2, a PCB 10, of the normal glass-fibre reinforced resin material, has a plurality of positions for mounting sockets on the top side or surface 11. These positions are indicated generally at 12. Each socket position 12 has, in the present example, eighteen contact pads **13*a* to 13*r*, each pad being connected to a similar pad 14*a* to 14*r* on the under side of surface 15. The pads 13 are connected to pads 14 by plated through holes 16**. The pads are seen more clearly in FIG. 1*a*.

The various pads at each socket position are connected in parallel. Thus all pads **13*a* and 14*a* are paralleled, pads 13*b* and 14*b* paralleled, and so on. This interconnection is done by a combination of printed conductors on the top surface 11 and printed conductors on the under surface 15. Thus pads 13*a* and 14*a* are interconnected by conductor 17 on the under surface 15, which conductor also connects to pad 101** at the side of the board.

Pads **13*b*/14*b* are interconnected in several steps. First the pads in each position 12 in one row are interconnected by a conductor 18 on the top surface (FIG. 1). By means of the plated through hole 19 connection is made to conductor 20 on the under surface (FIG. 2). A short conductor 21 connects a remaining one pad 13*b*/14*b* to the conductor 20. Conductor 20 connects the pad 118** at the side of the board.

Pads **13*c*/14*c* are interconnected in rows by conductors 23 on the under surface 15 which connect via plated through holes in an end pad to a conductor 25 on the top surface 11. A plated through hole for each conductor 25, connects conductor 25 to short conductor 26 on the under surface 26; and then via plated through holes 27 to conductor 28 on the top surface 11 which in turn connects to pad 102.**

Similar interconnections are made for the remaining pads 13/14 and to the pads 103 to 117. Interconnections between conductors on the top and under surfaces 11 and 15 are made by plated through holes, occuring at various positions and indicated generally at 30, apart from the particular holes described above.

Figure 3:
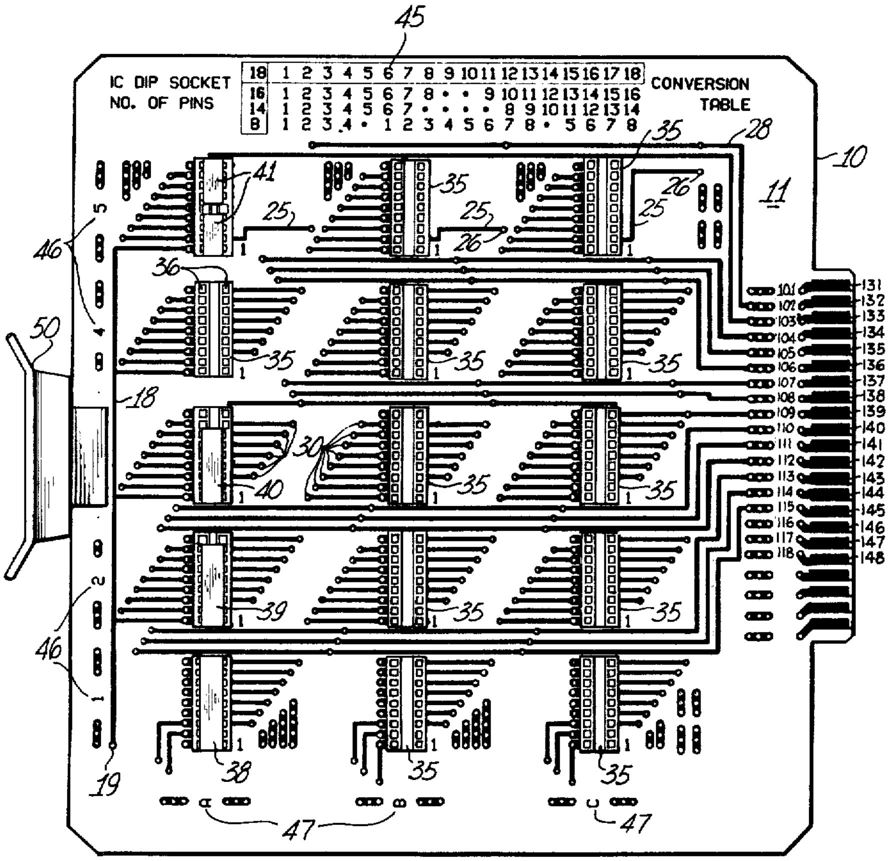
FIG. 3 is a similar view to that of FIG. 1 with sockets mounted on the PCB, and with devices inserted in some of the sockets.
Figure 4:
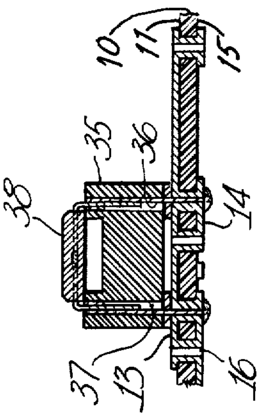
FIG. 4 is a cross-section on the line IV—IV of FIG. 3.

Sockets 35 are inserted at positions 12, as illustrated in FIG. 3. Each pad 13/14 has two plated through holes and the leads 36 (FIG. 4) of the sockets enter one hole in each pad. The provision of two holes enables sockets of different widths to be used. Thus, as illustrated, standard width sockets for 8–18 pins are acceptable to one set of holes and the wider standard width for 22 pin sockets are acceptable to the other set of holes. The sockets 35 each have two rows of contact holes or recesses 37 into which leads of devices can be inserted. Differing forms of devices can be inserted in the sockets and in FIG. 3 four different forms of device are shown. An 18 pin device is seen at 38, a 16 pin at 39, a 14 pin at 40 and two eight pin devices at 41. Normally all the devices on one board would be of the same form.

Depending upon the devices — that is structure, and the number of pins — or contacts, so the actual connections to the devices will vary. The connections between external sources and/or instruments and the devices is determined by the pattern of connections between pads 101–118 and external contact pads 131–148. Devices normally have a predetermined pin, or contact, arrangement and it is possible to predetermine equivalent pin numbers for different forms of devices as related to the socket contacts. This relationship is conveniently indicated on the board by a conversion table printed on one end of the board during production. Such a table is indicated at 45 in FIGS. 1 and 3.

Also at the time of printing the circuit, identification means are produced on the board. Thus each column is identified by a letter or numeral - in the example illustrated by a letter A, B, or C as indicated at 47. Each row is also identified, again in the example illustrated by a numeral 1, 2, 3, 4 or 5, as indicated at 46. Thus each socket, and each device in a socket can be identified as to position for recording details of characteristics, treatment and the like.

Figure 5:
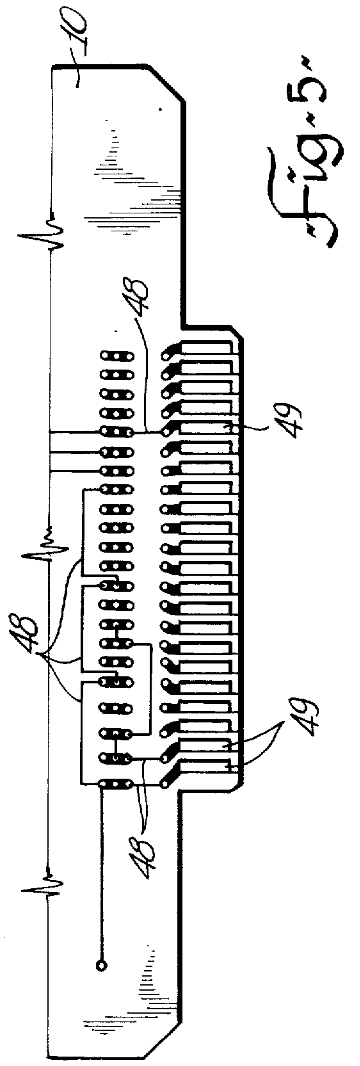
FIG. 5 is a plan view of one end of the top side of a PCB illustrating an interconnection pattern.
Figure 6:
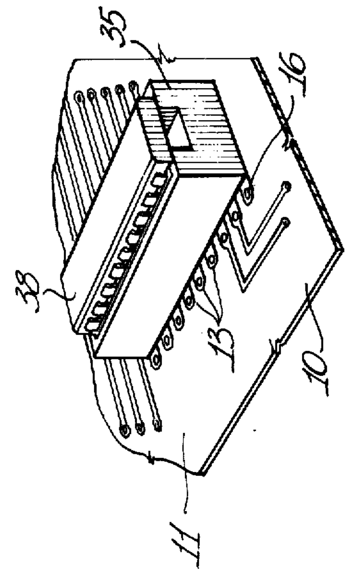
FIG. 6 is a perspective view of one socket on the board and a device inserted in the socket.

FIG. 5 illustrates one connection pattern for pads 101–118 and 131–148, for an eighteen pin IC. Typically the bias applied to the pins of the device is as follows:-

| | |
|---|---|
| Pins No. 1, 5, 10 and 15 | +20V |
| Pins No. 2, 3, 7 and 8 | −5V |

-continued

| | |
|---|---|
| Pins No. 18 | Ground |

The interconnections are made by jumpers indicated at 48. The external connections are indicated at 49. However it will be appreciated that the particular pattern details can be varied to give the same result.

The sockets 35 are permanently installed in the board, to the extent that the leads or pins of the sockets are soldered to the pads 14 on the undersurface 15 of the board. This is seen particularly in FIG. 4.

If a change in bias to be applied to a particular pin is required, then it is only necessary to make one connection change, instead of having to reverse or resolder fifteen connections, one for each device position. Often the only change is the plug-in connection at the board edge.

For convenience in handling the boards, a handle 50 can be provided at one edge.

What is claimed is:

1. A printed circuit board for mounting and connecting a plurality of semiconductor devices, comprising:

a rigid board of electrically insulating material;

a plurality of socket mounting positions on said board, said positions arranged in rows and columns;

each socket position comprising a two parallel rows of contact pads on a top surface of said board and two parallel rows of contact pads on a bottom surface of said board, said contact pads forming corresponding aligned pairs one on said top surface and one on said bottom surface;

at least one plated through hole in each pair of contact pads electrically interconnecting said pair of pads;

a plurality of connector pads adjacent one edge of said board, a connector pad for each pair of contact pads;

printed circuit means electrically interconnecting a corresponding pair of contact pads at each socket mounting position in parallel and to a selected one of said connector pads;

external contact pads at said one edge of said board, said external contact pads electrically connected with said connector pads in a predetermined pattern.

2. A printed circuit board as claimed in claim 1, including a socket permanently mounted at each socket mounting position, a corresponding pin on each socket being electrically connected in parallel with the corresponding pin on all the other sockets.

3. A printed circuit board as claimed in claim 1, including at least one plated through hole in each of said connector pads and a plated through hole in each of said external pads, said connector pads and said external contact pads by electrically connected jumper wires plugged in the plated through holes in said connector pads and said external pads.

4. A printed circuit board as claimed in claim 1, said printed circuit means interconnecting corresponding pairs of contact pads at each socket mounting position, comprising printed circuits on both top and bottom surfaces of said rigid board interconnecting between a part of a circuit on said top surface and a part of a circuit on said bottom surface comprising a plated through hole.

* * * * *